United States Patent
Desmet

(10) Patent No.: US 10,632,734 B2
(45) Date of Patent: Apr. 28, 2020

(54) LITHOGRAPHIC PRINTING PLATE PRECURSOR COMPRISING GRAPHITE OXIDE

(71) Applicants: AGFA NV, Mortsel (BE); AGFA-GEVAERT, Mortsel (BE)

(72) Inventor: Tim Desmet, Mortsel (BE)

(73) Assignees: AGFA NV, Mortsel (BE); AGFA-GEVAERT, Mortsel (BE)

( * ) Notice: Subject to any disclaimer, the term of this patent is extended or adjusted under 35 U.S.C. 154(b) by 96 days.

(21) Appl. No.: 15/746,515

(22) PCT Filed: Jul. 18, 2016

(86) PCT No.: PCT/EP2016/067051
§ 371 (c)(1),
(2) Date: Jan. 22, 2018

(87) PCT Pub. No.: WO2017/013060
PCT Pub. Date: Jan. 26, 2017

(65) Prior Publication Data
US 2018/0207925 A1    Jul. 26, 2018

(30) Foreign Application Priority Data
Jul. 23, 2015   (EP) .................................... 15178098

(51) Int. Cl.
| | | |
|---|---|---|
| *B41C 1/10* | (2006.01) | |
| *B41N 1/14* | (2006.01) | |
| *B41M 1/06* | (2006.01) | |
| *G03F 7/16* | (2006.01) | |
| *G03F 7/20* | (2006.01) | |
| *B82Y 30/00* | (2011.01) | |

(52) U.S. Cl.
CPC .............. *B41C 1/1041* (2013.01); *B41M 1/06* (2013.01); *B41N 1/14* (2013.01); *G03F 7/168* (2013.01); *G03F 7/20* (2013.01); *B82Y 30/00* (2013.01)

(58) Field of Classification Search
None
See application file for complete search history.

(56) References Cited

U.S. PATENT DOCUMENTS

2013/0078370 A1*  3/2013  Gal .......................... B41C 1/05
                                                         427/144
2015/0360477 A1* 12/2015  Khe ....................... B41J 11/002
                                                         347/47

FOREIGN PATENT DOCUMENTS

| EP | 0 770 494 A2 | 5/1997 |
|---|---|---|
| EP | 1 075 941 A2 | 2/2001 |
| EP | 1 235 105 A2 | 8/2002 |
| EP | 1 342 568 A1 | 9/2003 |
| WO | 02/21215 A1 | 3/2002 |
| WO | 2005/111727 A1 | 11/2005 |
| WO | 2011/072213 A2 | 6/2011 |

OTHER PUBLICATIONS

Official Communication issued in International Patent Application No. PCT/EP2016/067051, dated Sep. 29, 2016.

* cited by examiner

*Primary Examiner* — Joshua D Zimmerman
(74) *Attorney, Agent, or Firm* — Keating and Bennett, LLP

(57) ABSTRACT

A lithographic printing plate precursor includes, on a support, a layer of graphite oxide capable of switching from a hydrophilic state into a hydrophobic state upon exposure to heat and/or light.

15 Claims, No Drawings

LITHOGRAPHIC PRINTING PLATE PRECURSOR COMPRISING GRAPHITE OXIDE

CROSS REFERENCE TO RELATED APPLICATIONS

This application is a 371 National Stage Application of PCT/EP2016/067051, filed Jul. 18, 2016. This application claims the benefit of European Application No. 15178098.8, filed Jul. 23, 2015, which is incorporated by reference herein in its entirety.

BACKGROUND OF THE INVENTION

1. Field of the Invention

The present invention relates to a heat-sensitive printing plate precursor comprising graphite oxide capable of switching form a hydrophilic state to a hydrophobic state upon exposure to light and/or heat.

2. Description of the Related Art

Lithographic printing presses use a so-called printing master such as a printing plate which is mounted on a cylinder of the printing press. The master carries a lithographic image on its surface and a print is obtained by applying ink to said image and then transferring the ink from the master onto a receiver material, which is typically paper. In conventional, so-called "wet" lithographic printing, ink as well as an aqueous fountain solution (also called dampening liquid) are supplied to the lithographic image which consists of oleophilic (or hydrophobic, i.e. ink-accepting, water-repelling) areas as well as hydrophilic (or oleophobic, i.e. water-accepting, ink-repelling) areas. In so-called driographic printing, the lithographic image consists of ink-accepting and ink-abhesive (ink-repelling) areas and during driographic printing, only ink is supplied to the master.

Lithographic printing masters are generally obtained by the image-wise exposure and processing of an imaging material called plate precursor which contains a heat- or light-sensitive coating on a substrate. The coating of the precursor is exposed image-wise to heat or light, typically by means of a digitally modulated exposure device such as a laser, which triggers a (physico-)chemical process, such as ablation, polymerization, insolubilization by cross-linking of a polymer or by particle coagulation of a thermoplastic polymer latex, solubilization by the destruction of intermolecular interactions or by increasing the penetrability of a development barrier layer. The most popular plate precursors require wet processing with a developer since the exposure produces a difference of solubility or of rate of dissolution in a developer between the exposed and the non-exposed areas of the coating. In positive working plates, the exposed areas of the coating dissolve in the developer while the non-exposed areas remain resistant to the developer. In negative working plates, the non-exposed areas of the coating dissolve in the developer while the exposed areas remain resistant to the developer. Most plates contain a hydrophobic coating on a hydrophilic substrate, so that the areas which remain resistant to the developer define the ink-accepting, printing areas of the plate while the hydrophilic substrate is revealed by the dissolution of the coating in the developer in the non-printing areas.

Conventionally, a plate is developed by immersion in the developer as it passes through the processing apparatus. Typically the plate is also subjected to mechanical rubbing with e.g. a rotating brush while or after being immersed in the developer. After development, the plate is typically rinsed with water to remove any remaining developer and then gummed, which may also be called finished or desensitized. Gumming involves the application of a protective coating on the lithographic image, especially on the non-printing areas to avoid contamination or oxidation of the aluminium substrate.

An important trend in lithographic platemaking is related to ecology and sustainability. Systems and methods which enable a low consumption of developer or which allow processing with aqueous developers comprising no hazardous chemicals and/or which have a pH close to 7 (neutral developer), have attracted a lot of attention in the marketplace. A convenient method which has become popular involves the use of a gum solution as developer, whereby the plate is developed and gummed in a single step as described in e.g. EP1342568A and WO2005/111727.

Other so-called 'chemistry-free' processing methods involve the use of the printing press as processing apparatus: the exposed plate is mounted on the plate cylinder of the press and the lithographic image is then developed by means of the ink and/or fountain solution which is supplied to the plate during the first revolutions of the printing press as disclosed in e.g. EP770494A and WO2002/21215. Such methods also require specially designed plate coatings and may produce additional problems such as contamination of the fountain solution by the coating, which is removed in the non-printing areas, lack of daylight stability in the time between the exposure of the plate and the on-press development or the lack of a visible image (which allows quality inspection of the plate) before the plate is mounted on the press.

WO 2011/072213 discloses a method for producing graphene by exposing graphite oxide with ultraviolet, visible or infrared radiant energy. The method is used for locally generating heat for example in phototherapy, domestic purposes and/or desalination of water.

SUMMARY OF THE INVENTION

Preferred embodiments of the present invention provide a heat-sensitive lithographic printing plate precursor which requires no wet processing and which is capable of switching from a hydrophilic state into a hydrophobic state upon exposure to heat and/or light.

These advantages and benefits are realized by a heat-sensitive lithographic printing plate precursor comprising on a support a layer comprising graphite oxide.

A further preferred embodiment of the present invention provides a method for making a heat-sensitive lithographic printing plate which requires no wet processing and which can be directly exposed to heat and/or light by means of a laser with low power output.

Surprisingly, it was found that a lithographic printing plate precursor based on the switching reaction of graphite oxide to graphene-like structures provides after exposure to heat and/or light, a high quality printing plate. Indeed, upon image-wise exposure of a layer comprising graphite oxide, graphene-like structures are formed in the exposed areas which provide an excellent ink-receptivity as well as a good adhesion to the surface of the support providing sufficient resistance to fountain solutions and/or inks during printing.

It was further found that the exposed plate precursor shows a visible image immediately after the exposure step—i.e. a print-out image—which enables the end-user to establish immediately whether or not the precursor is already exposed to heat and/or light and/or to inspect the formed images on the printing plate.

Preferred embodiments of the present invention are described below.

DETAILED DESCRIPTION OF THE PREFERRED EMBODIMENTS

Graphite is a crystalline carbon-allotrope containing stacked layers of $sp^2$-hybridised carbon aromatic rings. Graphene corresponds to one or some of these pure monolayers. Graphene is chemically inert, strong, electrical conductive and hydrophobic and has been the subject of many research projects over the past years.

A preferred method for preparing graphene involves oxidation of graphite to graphite oxide whereby the interaction between the different layers in the graphite is disturbed and the introduction of oxygen-containing polar groups renders the obtained graphite oxide hydrophilic, and dispersible in water in the form of macroscopic flakes. This dispersion can be coated onto a substrate and subsequent irradiation with a laser causes a transformation of the hydrophilic graphite oxide to hydrophobic graphene or graphene-like structures. The quality of the starting material—i.e. the quality of the graphite oxide—as well as the oxidation reaction of the starting material may influence the quality of the obtained graphene or graphene-like structures. Also, the preparation method of the aqueous dispersion of graphite oxide may influence the properties of the obtained graphene or graphene-like structures.

According to a preferred embodiment of the present invention, it was found that a coating of a printing plate precursor including a layer comprising hydrophilic (or oleophobic, i.e. water-accepting, ink-repelling) graphite oxide causes the formation of hydrophobic (i.e. ink-accepting, water-repelling) areas upon exposure to heat and/or light. It is believed that at the exposed areas at least partially reduced graphite-oxide—also referred to herein as graphene-like structures—is formed. The layer including graphite oxide is further also referred to as "the image-recording layer".

Graphite oxide is preferably in the form of flakes. The flakes preferably have a diameter of 200 to 2000 nanometer; more preferably a diameter of 400 to 1500 nanometer; and most prerferably a diameter of 600 to 800 nanometer. The average thickness of the flakes may be between 1 and 50 nm. The flakes may be present in the imaging layer as a layered structure including one or more layers; preferably one layer. The content of monolayer graphite oxide in the imaging layer is preferably between 60% and 100%, more preferably between 70% and 98% and most preferably between 80% and 95%. The amount of graphite oxide in the image recording layer is preferably from 0.05 $mg/m^2$ to 10 $g/m^2$; more preferably from 0.1 $mg/m^2$ to 0.5 $g/m^2$; most preferably from 50 $mg/m^2$ to 0.2 $g/m^2$.

The image-recording layer may be applied on to a support by wet coating or by other known methods such as for example vapor deposition or spray coating. For this purpose, the graphite oxide may be dispersed in a liquid medium such as for example an aqueous solution or a solution including one or more organic solvents. Liquid media suitably used to disperse graphite oxide include but are not limited to aqueous-based media such as water; aqueous solutions including water and alcohols such as ethanol (e.g. the ethanol may be present in an amount from 10 to 90%, preferably from 20 to 80%, more preferably from 30 to 70% or from 40 to 60%, and most preferably in an amount of about 50% ethanol); solutions of polyethylene glycol (PEG) in water (e.g. from about 1% to about 10%, e.g. about 1, 2, 3, 4, 5, 6, 7, 8, 9 or 10% PEG in water); other alcohols such as methanol, isopropanol, etc., or other polar liquids such as acetonitrile, dimethylsulfoxide etc. The concentration of graphite oxide in the dispersion is preferably in the range from about 0.1 mg/ml (or even less) to about 10 mg/ml (or greater), more preferably in the range from about 1 mg/ml to about 8 mg/ml, and most preferably in the range between 2 and 6 mg/ml.

The coating preferably contains one or more infrared absorbing compound(s); preferably the infrared absorbing compound is present in the image-recording layer. Alternatively, the infrared absorbing compound(s) may be present in a separate layer, i.e. a light-absorbing layer, adjacent to the image-recording layer.

The infrared absorbing compound, also referred to herein as IR-absorbing compound, is preferably an infrared dye (IR-dye) or infrared pigment (IR-pigment), most preferably an IR-dye and absorbs visible and/or infrared (IR) radiation light and converts the absorbed energy into heat. More preferably, the IR-dye is an organic infrared absorbing dye and is preferably water dispersible, more preferably self-dispersing (no addition of surfactant) or encapsulated, and may be added to the coating as an aqueous dispersion. The IR-dye preferably includes a conjugated system also referred to as "chromophoric moiety". The chromophoric moiety has its main absorption in the infrared region, i.e. radiation having a wavelength in the range from 750 to 1500 nm, preferably in the range from 750 nm to 1250 nm, more preferably in the range from 750 nm to 1100 nm, and most preferably in the range from 780 nm to 900 nm. Preferably the chromophoric group has its absorption maximum in the infrared region. The IR-dye preferably absorbs laser light of 830 nm. In a particular embodiment, the IR-dye may be bonded by for example one or more covalent bond(s) to the graphene oxide.

Suitable examples of IR-dyes include, but are not limited to, polymethyl indoliums, metal complex IR dyes, indocyanine green, polymethine dyes, croconium dyes, cyanine dyes, merocyanine dyes, squarylium dyes, chalcogenopyryloarylidene dyes, metal thiolate complex dyes, bis(chalcogenopyrylo) polymethine dyes, dyes including a barbituric group, oxyindolizine dyes, bis(aminoaryl)polymethine dyes, indolizine dyes, pyrylium dyes, quinoid dyes, quinone dyes, phthalocyanine dyes, naphthalocyanine dyes, azo dyes, (metalized) azomethine dyes and combinations thereof. The cyanine dyes including five, seven or nine methine-groups disclosed in U.S. Pat. No. 6,515,811 in column 3 to column 40 having an absorption maximum in the wavelength region of 700 to 1200 nm; the infrared dyes having a chemical structure A-B-C disclosed in EP 2 722 367 [044] to [008] and the dyes disclosed in EP 1 093 015 and in EP 719 304, are preferred dyes.

Cyanine dyes are particularly preferred. The dyes described in EP 1 614 541 and PCT 2006/063327 which become intensively colored after exposure by infrared irradiation or heating and thereby form a visible image are of special interest. Examples of such cyanine dyes are disclosed in EP-A 1 142 707, paragraph [138], EP-A 1 614 541 (page 20 line 25 to page 44 line 29), EP 1 736 312 (paragraphs [0014] to [0021]), EP 1 910 082 and WO 2010/031758 page 6 to page 35. The latter application discloses IR-dyes which result in printing plates with a higher sensitivity and contain a substituent selected from bromo and iodo.

Other preferred IR-dyes are those disclosed in the EP 2 072 570. These infrared dyes have a structural element according to the following Formula:

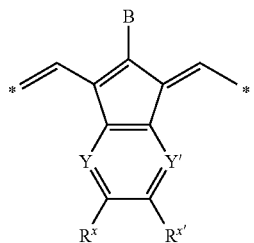

wherein
B represents hydrogen, halogen or a monovalent organic group;
Y and Y' independently represent —CH— or —N—;
$R^x$ and $R^{x'}$ independently represent hydrogen, an optionally substituted alkyl or aryl group or represent the necessary atoms to form a ring; and
*represent the linking positions to the rest of the infrared dye.

The monovalent organic group preferably represents an optionally substitued alkyl, aralkyl or aryl group, —OR$^a$, —SR$^b$, —SO$_2$R$^b$, —NR$^b$R$^c$, —NR$^b$(SO$_2$R$^d$) or —NR$^b$(CO$_2$R$^e$) wherein R$^a$ and R$^c$ represent an optionally substituted aryl group; R$^b$ represents an optionally substituted alkyl, aralkyl, aryl or heteroaryl group, R$^d$ represents an optionally substituted alkyl or aryl group or —NR$^{i1}$R$^{i2}$ wherein R$^{i1}$ and R$^{i2}$ independently represent hydrogen, an optionally substituted alkyl or aryl group and R$^e$ represents an optionally substituted alkyl group. Specific examples of suitable dyes are given in [0025] of EP 2 072 570.

IR-dyes disclosed in EP 1 736 312 in [0017] to [0025] wherein at least one group transformes by a chemical reaction induced by exposure to IR radiation or heat into a group which is a stronger electron-donor, are also preferred. Other preferred IR-dyes are N-meso substituted cyanine, merocyanine or oxonole dyes including electron withdrawing groups and have a structural element according to one of the following Formula's, as disclosed in WO 2009/080689:

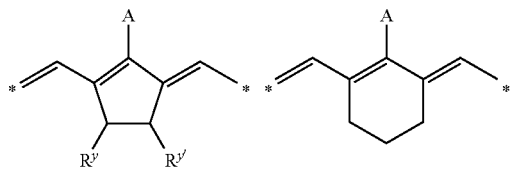

Wherein
A represents hydrogen, halogen, —NR$^1$—CO—R$^2$ or —NR$^1$—SO$_2$R$^3$;
R$^1$ represents hydrogen or an optionally substituted alkyl or (hetero)aryl group, SO$_3^-$, COOR$^4$ or forms together with R$^2$ or R$^3$ a ring structure;
R$^2$ and R$^3$ independently represent an optionally substituted alkyl or (hetero)aryl group, OR$^5$, NR$^6$R$^7$ or CF$_3$;
R$^5$ represents an optionally substituted alkyl or (hetero)aryl group;
R$^6$ and R$^7$ independently represent hydrogen, an optionally substituted alkyl or (hetero)aryl group, or form a ring structure together;
R$^y$ and R$^{y'}$ independently represent hydrogen, an optionally substituted alkyl group or represent the necessary atoms to form an optionally substituted ring structure, preferably an optionally substituted 5- or 6-membered ring; most preferably an optionally substituted 5-membered ring; and * represent the linking positions to the rest of the IR dye.

More preferably, A represents —NR$^8$—CO—OC(CH$_3$)$_3$; —NR$^8$—SO$_2$—CF$_3$ or —NR$^8$—SO$_2$—C$_6$H$_4$—R$^9$, wherein R$^8$ and R$^9$ independently represent hydrogen or an alkyl group. For example —NCH$_3$—CC—OC(CH$_3$)$_3$—, —NCH$_3$—SO$_2$—CF$_3$ or —NCH$_3$—SO$_2$—C$_6$H$_4$—CH$_3$ are particularly preferred groups. Specific dyes are disclosed on page 18 line 1 to page 21 line 5 and on page 26 line 5 to page 33 line 10 of WO2009/080689. For example, the dyes according to the following formula are particularly preferred:

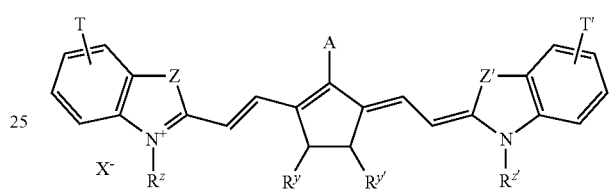

Wherein
A and R$^y$ and R$^{y'}$ are as defined above;
T and T' independently represent one or more substituents or an annulated ring such as one or more optionally substituted 5- or 6-membered rings;
Z and Z' independently represent —O—, —S—, —CR$^{10}$R$^{11}$C— or —CH=CH— wherein R$^{10}$ and R$^{11}$ independently represent an alkyl or aryl group; preferably R$^{10}$ and R$^{11}$ independently represent an alkyl group; most preferably R$^{10}$ and R$^{11}$ independently represent a methyl or ethyl gorup;
R$^z$ and R$^{z'}$ independently represent an optionally substituted alkyl group; preferably a methyl, ethyl, or a SO$_3$— substitued alkyl group such as —C$_2$H$_4$—SO$_3^-$, —C$_3$H$_6$—SO$_3$, —C$_4$H$_8$—SO$_3^-$ or —C$_5$H$_{10}$—SO$_3^-$;
X$^-$ renders the dye neutral; preferably X$^-$ represents a halide anion such as Cl$^-$, Br$^-$ or I$^-$, a sulfonate anion such as CH$_3$SO$_3^-$, CF$_3$SO$_3^-$, p-toluene sulfonate, tetrafluoroborate or hexafluorophosphate anion.

Specific structures of suitable dyes include:

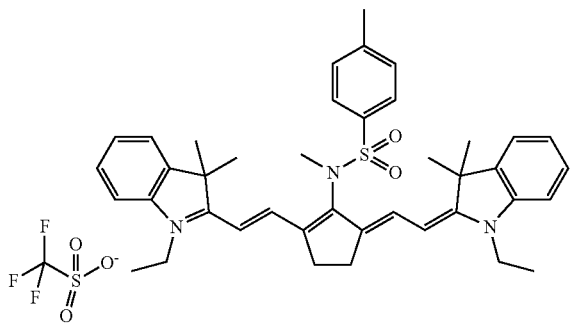

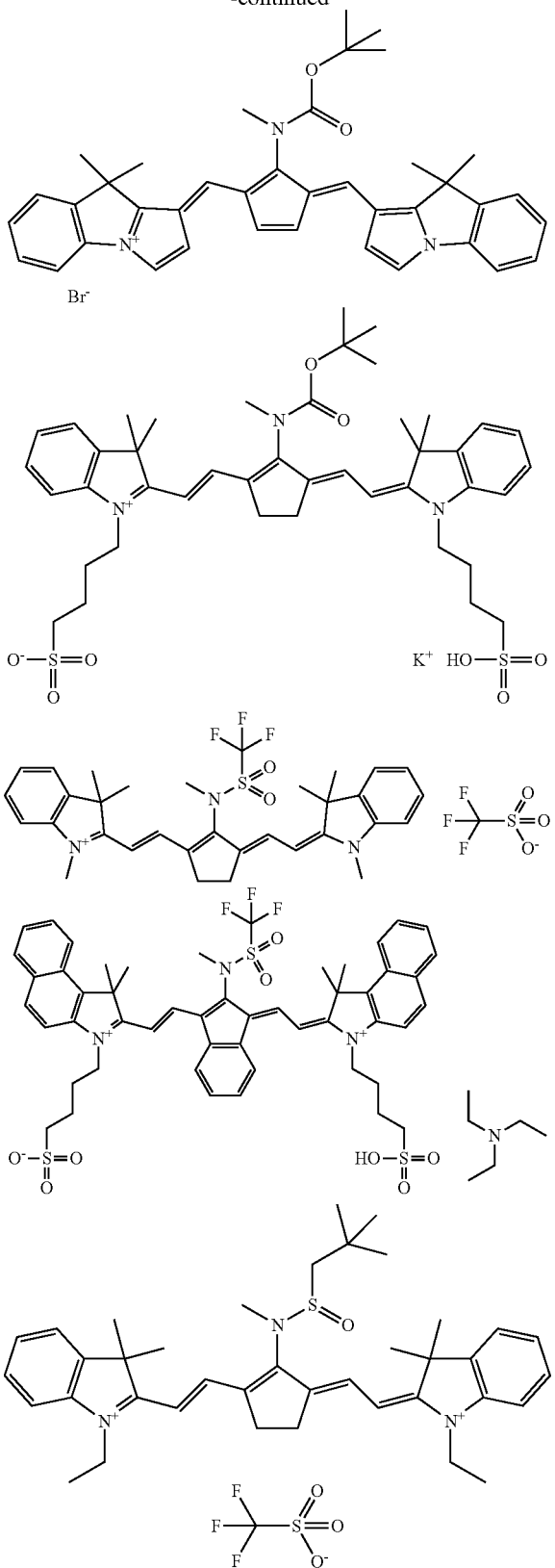

tyl; 1,1-dimethyl-propyl; 2,2-dimethylpropyl or 2-methylbutyl. The aryl group is preferably a phenyl, naphthyl, benzyl, tolyl, ortho- meta- or para-xylyl, anthracenyl or phenanthrenyl. A phenyl group or naphthyl group are most preferred. The heteroaryl group referred to herein is preferably a five- or six-membered ring substituted by one, two or three oxygen atoms, nitrogen atoms, sulphur atoms, selenium atoms or combinations thereof. Examples include pyridyl, pyrimidyl, pyrazoyl, triazinyl, imidazolyl, (1,2,3)- and (1,2,4)-triazolyl, tetrazolyl, furyl, thienyl, isoxazolyl, thiazolyl and carbazoyl.

The optionally substituted 5- or 6-membered ring preferably represent an aryl or heteroaryl group.

The aralalkyl group referred to herein is preferably a phenyl or naphthyl group including one, two, three or more $C_1$ to $C_6$-alkyl groups. Suitable aralkyl groups include for example phenyl groups or naphthyl groups including one, two, three or more $C_1$ to $C_6$-alkyl groups.

The optional substituents mentioned above are preferably selected from an alkyl group such as a methyl, ethyl, n-propyl, isopropyl, n-butyl, 1-isobutyl, 2-isobutyl and tertiary-butyl group; an ester, amide, ether, thioether, ketone, aldehyde, sulfoxide, sulfone, sulfonate ester or sulphonamide group, a halogen such as fluorine, chlorine, bromine or iodine, —OH, —SH, —CN and —NO$_2$, and/or combinations thereof.

Suitable examples of IR-pigments include, organic pigments, inorganic pigments, carbon black, metallic powder pigments and fluorescent pigments. Specific examples of organic pigments include quinacridone pigments, quinacridonequinone pigments, dioxazine pigments, phthalocyanine pigments, anthrapyrimidine pigments, anthanthrone pigments, indanthrone pigments, flavanthrone pigments, perylene pigments, diketopyrrolopyrrole pigments, perinone pigments, quinophthalone pigments, anthraquinone pigments, thioindigo pigments, benzimidazolone pigments, isoindolinone pigments, azomethine pigments, and azo pigments.

In a preferred embodiment of the present invention, the pigments have a hydrophilic surface. The hydrophilicity of the surface may be formed by the presence of hydrophilic groups, such as anionic or non-ionic groups, on the surface of the pigment particle. A hydrophilic surface may be formed by surface treatment, coating or adsorption of compounds such as hydrophilic polymers, reactive materials (e.g. silane coupling agent, an epoxy compound, polyisocyanate, or the like), surfactants (e.g. anionic or non-ionic surfactants) or water soluble salts (e.g. salts of phosphoric acid). Typical hydrophilic polymers are polymers or copolymers having anionic groups such as carboxylic acid, sulphonic acid, phosphonic acid, phosphoric acid, or salts thereof, or having a polyalkylene oxide group such as polyethyleneoxide. Carbon dispersions in water such as CAB O JET 200 and phthalocyanine pigment dispersions in water such as CAB O JET 250, both commercially available from CABOT, are most preferred. Suitable examples of pigments with surface treatment are the modified pigments described in WO 02/04210 and EP 1 524 112.

The pigments preferably have a particle size which is preferably less than 10 μm, more preferably less than 5 μm and especially preferably less than 3 μm. Preferably, the pigment is dispersed in a liquid, preferably an aqueous liquid. Such aqueous liquids include water and mixtures of water with water-miscible organic solvents such as alcohols e.g. methanol, ethanol, 2-propanol, butanol, iso-amyl alcohol, octanol, cetyl alcohol etc; glycols e.g. ethylene glycol; glycerine; N-methyl pyrrolidone; methoxypropanol; and The alkyl group referred to herein is preferably a $C_1$ to $C_6$-alkyl group such as for example methyl; ethyl; propyl; n-propyl; isopropyl; n-butyl; isobutyl; tertiary-butyl; n-penketones e.g. 2-propanone and 2-butanone etc. The dispersion preferably includes one or more compounds which stabilise the dispersion and prevents coalescing of the particles. Suitable dispersing agents are surfactants and/or polymers which are soluble in the dispersion liquid.

The amount of IR-absorbing compound in the coating is preferably at least 4% by weight, more preferred at least 6% by weight, and most preferably at least 10% by weight. In a preferred embodiment, the amount of IR-absorbing compound in the coating is preferably between 5 and 50% by weight, more preferably between 8 and 40% by weight and most preferably between 10 and 20% by weight. These amounts are relative to the coating as a whole.

The coating may also contain one or more additional ingredients. For example, one or more binders, polymer particles such as matting agents and spacers, surfactants such as perfluoro surfactants, silicon or titanium dioxide particles, or colorants are well-known components. These ingredients may be present in the image-recording layer or in on optional other layer such as for example the optional light absorbing layer, the optional subbing layer, an optional protective layer or other layer.

Optionally, the coating may further comprise one or more binders selected from hydrophilic binders such as homopolymers and copolymers of vinyl alcohol, (meth)acrylamide, methylol (meth)acrylamide, (meth)acrylic acid, hydroxyethyl (meth)acrylate, maleic anhydride/vinylmethylether copolymers, polystyrene sulfonic acid, copolymers of (meth)acrylic acid or vinylalcohol with styrene sulphonic acid; polythiophene such as poly(3,4-ethylenedioxythiophene), polymers having an acidic group, vinyl acetals or vinylamides and polymers of phenylacrylates and copolymers of hydroxy-phenylmaleimides; polymers having units of vinylaromatics, N-aryl(meth)acrylamides or aryl (meth)acrylates containing optionally one or more carboxyl groups, phenolic hydroxyl groups, sulfamoyl groups or carbamoyl groups such as polymers having units of 2-hydroxyphenyl (meth)acrylate, of N-(4-hydroxyphenyl) (meth)acrylamide, of N-(4-sulfamoylphenyl)-(meth)acrylamide, of N-(4-hydroxy-3,5-dimethylbenzyl)-(meth)acrylamide, or 4-hydroxystyrene or of hydroxyphenylmaleimide; vinylaromatics, methyl (meth)acrylate, phenyl(meth)acrylate, benzyl (meth)acrylate, methacrylamide or acrylonitrile. The binder may be present in the imaging layer or in an optional other layer. The level of binder in the coating is preferably between 0.5% wt and 50% wt, more preferably between 0.5% wt and 25% wt and most preferably between 1 and 10% wt. The amounts are relative to the coating as a whole.

The printing plate precursor of the current invention comprises a support. Between the support and the image-recording layer and/or the light-absorbing layer, there may be additional layers such as for example one or more so-called primer or subbing layers which improves the adhesion of the other layers to the support, or an antihalation layer containing dyes or pigments which absorb any light that has passed the light-absorbing layer(s). Useful subbing layers for this purpose are well known in the photographic art and include, for example, polymers of vinylidene chloride such as vinylidene chloride/acrylonitrile/acrylic acid terpolymers or vinylidene chloride/methyl acrylate/itaconic acid terpolymers. Typically, a subbing layer has a dry thickness of no more than 2 µm or preferably no more than 200 mg/m$^2$.

The support may be a transparent polymeric support such as a transparent axially stretched polyester support. Suitable transparent polymeric supports include cellulose acetate propionate or cellulose acetate butyrate, polyesters such as polyethylene terephthalate and polyethylene naphthalate, polyamides, polycarbonates, polyimides, polyolefins, polyvinylchlorides, polyvinylacetals, polyethers and polysulphonamides. The transparent polymeric support is preferably provided with a hydrophylic layer. The hydrophylic layer is preferably a cross-linked hydrophilic layer obtained from a hydrophilic binder cross-linked with a hardening agent such as formaldehyde, glyoxal, polyisocyanate or a hydrolyzed tetra-alkylorthosilicate. The latter is particularly preferred. The thickness of the hydrophilic layer may vary in the range of 0.2 to 25 µm and is preferably 1 to 10 µm. The hydrophilic binder for use in the hydrophilic layer is e.g. a hydrophilic (co)polymer such as homopolymers and copolymers of vinyl alcohol, acrylamide, methylol acrylamide, methylol methacrylamide, acrylate acid, methacrylate acid, hydroxyethyl acrylate, hydroxyethyl methacrylate or maleic anhydride/vinylmethylether copolymers. The hydrophilicity of the (co)polymer or (co)polymer mixture used is preferably the same as or higher than the hydrophilicity of polyvinyl acetate hydrolyzed to at least an extent of 60% by weight, preferably 80% by weight. The amount of hardening agent, in particular tetra-alkyl orthosilicate, is preferably at least 0.2 parts per part by weight of hydrophilic binder, more preferably between 0.5 and 5 parts by weight, most preferably between 1 parts and 3 parts by weight.

According to another embodiment the hydrophilic layer may also comprise $Al_2O_3$ and an optional binder. Deposition methods for the $Al_2O_3$ onto the flexible support may be (i) physical vapor deposition including reactive sputtering, RF-sputtering, pulsed laser PVD and evaporation of aluminium, (ii) chemical vapor deposition under both vacuum and non-vacuum condition, (iii) chemical solution deposition including spray coating, dipcoating, spincoating, chemical bath deposition, selective ion layer adsorption and reaction, liquid phase deposition and electroless deposition. The $Al_2O_3$ powder can be prepared using different techniques including flame pyrolisis, ball milling, precipitation, hydrothermal synthesis, aerosol synthesis, emulsion synthesis, sol-gel synthesis (solvent based), solution-gel synthesis (water based) and gas phase synthesis. The particle size of the $Al_2O_3$ powders can vary between 2 nm and 30 µm; more preferably between 100 nm and 2 µm.

The hydrophilic layer may also contain substances that increase the mechanical strength and the porosity of the layer. For this purpose colloidal silica may be used. The colloidal silica employed may be in the form of any commercially available water dispersion of colloidal silica for example having a particle size up to 40 nm, e.g. 20 nm. In addition inert particles of larger size than the colloidal silica may be added e.g. silica prepared according to Stöber as described in J. Colloid and Interface Sci., Vol. 26, 1968, pages 62 to 69 or alumina particles or particles having an average diameter of at least 100 nm which are particles of titanium dioxide or other heavy metal oxides.

Particular examples of suitable hydrophilic layers are disclosed in EP 601240, GB 1419512, FR 2300354, U.S. Pat. Nos. 3,971,660, and 4,284,705.

Preferably, the support is a metal support such as aluminium or stainless steel. The support can also be a laminate comprising an aluminium foil and a plastic layer, e.g. polyester film. Preferably, the support is aluminium, more preferred grained and anodized aluminium. The aluminium is preferably grained by electrochemical graining, and preferably anodized by means of anodizing techniques employing phosphoric acid or a sulphuric acid/phosphoric acid mixture. Methods of both graining and anodization of aluminium are very well known in the art.

By graining (or roughening) the aluminium support, both the adhesion of the printing image and the wetting characteristics of the non-image areas are improved. By varying the type and/or concentration of the electrolyte and the applied voltage in the graining step, different type of grains can be obtained. By anodizing the aluminium support, its abrasion resistance and hydrophilic nature are improved. The microstructure as well as the thickness of the $Al_2O_3$ layer are determined by the anodizing step, the anodic weight (g/m$^2$ $Al_2O_3$ formed on the aluminium surface) varies between 1 and 8 g/m$^2$.

The grained and anodized aluminium support is preferably used without further post-treatment, however, the grained and anodized aluminium support may be post-treated to improve the hydrophilic properties of its surface. For example, the aluminium oxide surface may be silicated by treating its surface with a sodium silicate solution at elevated temperature, e.g. 95° C. Alternatively, a phosphate treatment may be applied which involves treating the aluminium oxide surface with a phosphate solution that may further contain an inorganic fluoride. Further, the aluminium oxide surface may be rinsed with an organic acid and/or salt thereof, e.g. carboxylic acids, hydrocarboxylic acids, sulphonic acids or phosphonic acids, or their salts, e.g. succinates, phosphates, phosphonates, sulphates, and sulphonates. A citric acid or citrate solution is preferred. This treatment may be carried out at room temperature or may be carried out at a slightly elevated temperature of about 30° C. to 50° C. A further interesting treatment involves rinsing the aluminium oxide surface with a bicarbonate solution. Still further, the aluminium oxide surface may be treated with polyvinylphosphonic acid, polyvinylmethylphosphonic acid, phosphoric acid esters of polyvinyl alcohol, polyvinylsulfonic acid, polyvinylbenzenesulfonic acid, sulfuric acid esters of polyvinyl alcohol, and acetals of polyvinyl alcohols formed by reaction with a sulfonated aliphatic aldehyde. It is further evident that one or more of these post treatments may be carried out alone or in combination. More detailed descriptions of these treatments are given in GB 1084070, DE 4423140, DE 4417907, EP 659909, EP 537633, DE 4001466, EP A 292801, EP A 291760 and U.S. Pat. No. 4,458,005. In the embodiment wherein the support is post-treated, a silicate treatment is highly preferred.

To protect the surface of the printing plate precursor, in particular from mechanical damage, a protective layer may also optionally be applied on top of the coating. Such protective top layer(s) should be soluble in ink and/or fountain solutions that are supplied during the printing step. A suitable protective top layer comprises polyvinylalcohol.

The protective layer generally comprises at least one water-soluble polymeric binder, such as polyvinyl alcohol, polyvinylpyrrolidone, partially hydrolyzed polyvinyl acetates, gelatin, carbohydrates or hydroxyethylcellulose, and can be produced in any known manner such as from an aqueous solution or dispersion which may, if required, contain small amounts, i.e. less than 5% by weight, based on the total weight of the coating solvents for the protective layer, of organic solvents. The thickness of the protective layer can suitably be any amount, advantageously up to 5.0 μm, preferably from 0.05 to 3.0 μm, particularly preferably from 0.10 to 1.0 μm.

According to a preferred embodiment of the present invention there is also provided a method for making a printing plate precursor comprising the step of applying the coating as described above followed by drying the layer.

Preferable, the imaging layer has a thickness upto 10 μm, more preferably upto 5 μm. Alternatively, the image-recording layer preferably has a thickness between 0.01 μm to 1 μm, more preferably between 0.02 μm to 0.5 μm and most preferably between 0.03 μm to 0.1 μm.

The printing plate precursor can be image-wise exposed directly with heat, e.g. by means of a thermal head, or indirectly by infrared light, preferably near infrared light. The infrared light is converted into heat by one or more IR-dye(s) as discussed above. Any source that provides a suitable wavelength of light may be used in the practice of the invention. The printing plate precursor can be exposed to infrared light by means of e.g. LEDs or an infrared laser. Preferably, the light used for the exposure is a laser emitting near infrared light having a wavelength in the range from about 700 to about 1500 nm, e.g. a semiconductor laser diode, a Nd:YAG or a Nd:YLF laser. The laser power is determined by the pixel dwell time of the laser beam, which is determined by the spot diameter (typical value of modern plate-setters at $1/e^2$ of maximum intensity: 10-25 μm), the scan speed and the resolution of the exposure apparatus (i.e. the number of addressable pixels per unit of linear distance, often expressed in dots per inch or dpi; typical value: 1000-4000 dpi). The power of the laser radiation is preferably in the range from about 1 Watt (W) to about 10 W, preferably in the range from about 2 W to about 9 W, more preferably in the range from about 3 W to about 8 W, i.e. about 1, 2, 3, 4, 5, 6, 7, 8, 9, or 10 W. The frequency (i.e. the number of cycles per second, "hertz" or "Hz") is preferably in the range from about 10 to about 50 Hz, more preferably from about 20 to about 40 Hz, and most preferably about 30 Hz. It is up to the person skilled in the art to adapt the above described variables, wavelength, power and frequency which are interdependent.

Most preferably, the printing plate is after exposure mounted on a printing press where the print job is started by applying ink and/or dampening liquid (fountain solution) without first processing the exposed plate.

In a specific embodiment, the exposed printing plate precursor may be developed by supplying an aqueous alkaline solution, and/or a suitable solvent, and/or a gum solution and/or by rinsing it with plain water or an aqueous liquid, whereby the non-imaged areas of the coating are removed. The gum solution which can be used in the development step, is typically an aqueous liquid which comprises one or more surface protective compounds that are capable of protecting the coating against contamination or damaging. Suitable examples of such compounds are film-forming hydrophilic polymers or surfactants. The gum solution has preferably a pH from 4 to 10, more preferably from 5 to 8. Preferred gum solutions are described in EP 1,342,568.

The development step may be combined with mechanical rubbing, e.g. by a rotating brush. During the development step, any water-soluble protective layer present is preferably also removed. The development step with an aqueous alkaline solution may be followed by a rinsing step and/or a gumming step.

The development step with an aqueous alkaline solution may be followed by a rinsing step and/or a gumming step. The gumming step involves post-treatment of the lithographic printing plate with a gum solution. The printing plate can, if required, be post-treated with a suitable correcting agent or preservative as known in the art.

According to a preferred embodiment of the present invention there is also provided a method for making a printing plate comprising the steps of image-wise exposing the printing plate precursor directly with heat, e.g. by means of a thermal head, or indirectly by infrared light, preferably near infrared light. The details concerning the exposure step are explained above.

The printing plate can be used for conventional, so-called wet offset printing, in which ink and an aqueous dampening liquid are supplied to the plate. Another suitable printing method uses so-called single-fluid ink without a dampening liquid. Suitable single-fluid inks have been described in U.S. Pat. Nos. 4,045,232; 4,981,517 and 6,140,392. In a most preferred embodiment, the single-fluid ink comprises an ink phase, also called the hydrophobic or oleophilic phase, and a polyol phase as described in WO 00/32705.

The switching reaction of graphite oxide to graphene-like structures implies, besides the hydrophilic to hydrophobic switch, also an isolator to conductor switch. Therefore this working principle may be used in other applications such as for example for the preparation of flexible electronics and other conductive materials.

EXAMPLES

1. Preparation of the Support

A 0.3 mm thick aluminium foil was degreased by spraying with an aqueous solution containing 34 g/l NaOH at 70° C. for 6 seconds and rinsed with demineralised water for 3.6 seconds. The foil was then electrochemically grained during 8 seconds using an alternating current in an aqueous solution containing 15 g/l HCl, 15 g/l $SO_4^{2-}$ ions and 5 g/l $Al^{3+}$ ions at a temperature of 37° C. and a current density of about 100 $A/dm^2$ (charge density of about 800 $C/dm^2$). Afterwards, the aluminium foil was desmutted by etching with an aqueous solution containing 6.5 g/l of sodium hydroxide at 35° C. for 5 seconds and rinsed with demineralised water for 4 seconds. The foil was subsequently subjected to anodic oxidation during 10 seconds in an aqueous solution containing 145 g/l of sulfuric acid at a temperature of 57° C. and an anodic charge of 250° $C./dm^2$, then washed with demineralised water for 7 seconds and dried at 120° C. for 7 seconds.

The support thus obtained (support S-00) was characterised by a surface roughness $R_a$ of 0.45-0.50 μm (measured with interferometer NT3300 and had an anodic weight of about 3.0 $g/m^2$ (gravimetric analysis).

2. Test Samples TS-00 to TS-03.

The test samples TS-00 to TS-03 were produced by applying a coating solution onto a PET substrate by means of a semi-automated coating device. The coating solutions were applied at a wet coating thickness of 34 μm and then dried at 60° C. for 3 minutes. The dry coating weight in $mg/m^2$ of each of the ingredients is indicated in Table 1.

The coating solutions contain the ingredients as defined in Table 1, dissolved in water.

3. Printing Plate Precursors PPP-00 to PPP-03

The printing plate precursors PPP-00 to PPP-03 were produced by applying a coating solution onto the above described support S-00 by means of a semi-automated coating device. The coating solutions were applied at a wet coating thickness of 34 μm and then dried at 60° C. for 3 minutes. The dry coating weight in $mg/m^2$ of each of the ingredients is indicated in Table 1.

The coating solutions contain the ingredients as defined in Table 1, dissolved in water.

TABLE 1 dry coating weight of the coating compositions.

| INGREDIENTS* | $mg/m^2$ |
|---|---|
| Graphite oxide (1) | 108.7 |
| Tivida FL 2300 (2) | 8.64 |
| PSS (3) | 1.36 |
| IR absorbing compound (4) | 17.3 |
| Dry coating weight | 136.0 |

*active ingredients in the coating
(1) Aqueous dispersion of graphite oxide; commercially available from Graphenea;
(2) surfactant commercially available from Merck KGaA;
(3) polystyrene sulfonic acid;
(4) see Table 2;

TABLE 2

Printing plate precursors PPP-00 to PPP-03

| Test samples | Printing plate precursor | Composition | IR absorbing compound |
|---|---|---|---|
| TS-00 reference | PPP-00 reference | Reference composition | — |
| TS-01 inventive | PPP-01 inventive | composition-01 | IR-01 (1) |
| TS-02 inventive | PPP-02 inventive | composition-02 | IR-02 (2) |
| TS-03 inventive | PPP-03 inventive | composition-03 | CAB-O-JET 300 (3) |

(1) IR-01: dispersion in water; may be prepared by well known synthesis methods such as for example disclosed in EP 2 072 570;

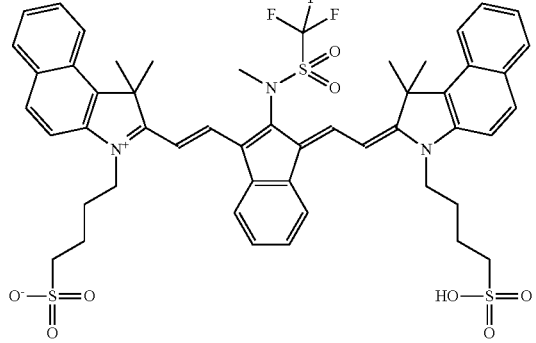

(2) IR-02: dispersion in water, synthesis as described in WO2009/080689, Example 15; Preparation of D-09, page 48:

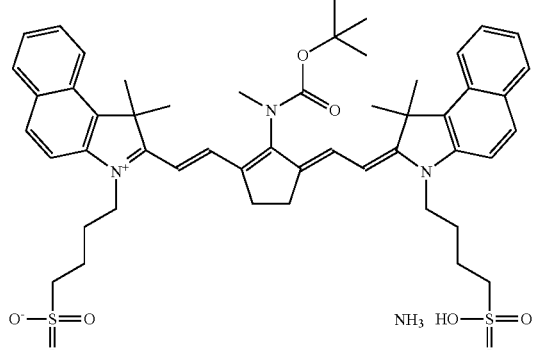

(3) CAB-O-JET 300, 15%: carbon black solution; commercially available from CABOT CORPORATION;

4. Visual Appearance of the Graphite Oxide Coatings

The visual evaluation of the coating was determined by observing (i) the homogeneity of the coating, (ii) the level of overly concentrated dark regions of graphite oxide and (iii) the level of uncoated regions on the substrate. A scale ranging from 1 (=bad coating appearance) to 5 (=excellent coating appearance) was employed. The results of the evaluation are given in Table 3.

TABLE 3

Visual evaluation of graphite oxide coatings.

| Printing plate precursor | Visual appearance* | Test sample | Visual appearance* |
|---|---|---|---|
| PPP-00 reference | 3.5 | TS-00 reference | 4.0 |
| PPP-01 inventive | 3.5 | TS-01 inventive | 4.0 |
| PPP-03 inventive | 3.5 | TS-02 inventive | 3.5 |
| PPP-07 inventive | 4.5 | TS-03 inventive | 4.5 |

*1 = unhomogeneous coating including a high level of uncoated areas and a high level of overly concentrated regions;
2 = unhomogeneous coating including many uncoated areas and many overly concentrated regions;
3 = unhomogeneous to homogeneous coating including some uncoated areas and some overly concentrated regions;
4 = rather homogeneous coating including only a few overly concentrated regions;
5 = complete homogeneous coating evenly colored (no overly concentrated regions).

The results indicate that the reference composition and the inventive compositions composition-01 to composition-03 are well-coatable on respectively the aluminium support (printing plate precursors) and the PET support (test samples).

5. Image-Wise Exposure of the Printing Plate Precursors PPP-00 to PPP-03

The printing plate precursors PPP-00 to PPP-03 on aluminium support S-00 were image-wise exposed in a range of energy densities (300 mJ/cm$^2$ to 200 mJ/cm$^2$) with a Creo Trendsetter, a platesetter having a 40 W infrared laser head (830 nm) commercially available from Eastman Kodak Corp. The printing plates PP-00 to PP-03 were obtained.

Six different exposure energy densities were tested to determine the ability of the IR-absorbing compounds to show an improvement in the graphite oxide to graphene-like structures switch in comparison to the reference printing plate precursor PPP-00 where no IR-absorbing compound is present. The evaluation of the switch was visual: graphite oxide appears brownish whereas the graphene-like structures obtained after exposure are darker (black). The results of the visual evaluation is given in Table 4.

TABLE 4

Evaluation of the graphite oxide to graphene switch

| Printing plate precursor | Exposure energy density mJ/cm$^2$ Results* | | | | | |
|---|---|---|---|---|---|---|
| | 300 | 280 | 260 | 240 | 220 | 200 |
| Reference PPP-00 | + | + | + | − | − | − |
| PPP-01 | ++ | ++ | +++ | +++ | +++ | +++ |
| PPP-02 | ++ | ++ | +++ | +++ | +++ | +++ |
| PPP-03 | ++ | + | + | + | + | + |

*−: no clear graphite oxide to grapheme/graphene-like structures switch;
+: clear graphite oxide to garphene/graphene-like structures switch;
++: even more pronounced graphite oxide to graphene/graphene-like structures switch;
+++: excellent graphite oxide to grapheme/graphene-like structures switch.

The results show that at the lower exposure energies—i.e. 200 mJ/cm$^2$ to 240 mJ/cm$^2$—there is no clear graphite oxide to graphene/graphene-like structures switch of the reference printing plate precursor PPP-00 while at the higher exposure energies—i.e. 260 mJ/cm$^2$ to 300 mJ/cm$^2$—a clear switch occurs. The IR-absorbing compounds IR-01 and IR-02 (printing plate precursors PPP-01 and PPP-02) improve the switch quality and efficiency compared to the reference printing plate precursor PPP-00. The IR-pigment CABO-JET-O-JET 300 (printing plate precursor PPP-03) also improves the irradiation quality, especially at the lower exposure energies 220 mJ/cm$^2$ to 240 mJ/cm$^2$.

Furthermore, the infrared absorbing compounds allow a large operating window as the graphite oxide to graphene/graphene-like structures switch is obtained at exposure energies ranging from 200 to 300 mJ/cm$^2$.

3.2.4 Printing Test

Printing was performed by mounting the reference printing plate PP-00 and the inventive printing plates PP-01 to PP-03 on a Heidelberg GTO 46 printing press (available from Heidelberg). Each print job was started using K+E Novavit 800 Skinnex ink (trademark of BASF Druckfarben GmbH) and 2 wt % Prima FS404 (trademark of Agfa Graphics NV) in water as fountain solution. A compressible blanket was used and printing was performed on non-coated offset paper.

The results of the print test confirm that the printing plates including the IR-dyes and IR-pigment improve the switch of graphite oxide to graphene-like structures compared to the reference printing plate including no infrared absorbing compound.

The roll-up performance—i.e. the amount of pages that need to be printed to obtain ink-free non-image areas—was determined. The results show that the roll-up performance of the printing plates including the IR-dyes (PP-01 and PP-02) is improved compared to the reference printing plate while the roll-up performance of the printing plate including the IR-pigment (PP-03) is >100 pages.

TABLE 5

Roll-up performance of the printing plates

| Printing plate | amount of pages |
|---|---|
| Reference PP-00 | 50 |
| PP-01 | 30 |
| PP-02 | 25 |
| PP-03 | >100 |

The invention claimed is:

1. A heat-sensitive lithographic printing plate precursor comprising:
   a support; and
   a coating on the support and including an imaging layer including graphite oxide that converts from a hydrophilic state to a hydrophobic state upon exposure to heat and/or light; wherein
   the imaging layer has a thickness up to 10 μm.

2. The printing plate precursor according to claim 1, wherein the graphite oxide is present in the imaging layer in an amount from 0.05 mg/m$^2$ to 10 g/m$^2$.

3. The printing plate precursor according to claim 1, wherein the support includes aluminum.

4. The printing plate precursor according to claim 3, wherein the aluminum is grained and anodized.

5. The printing plate precursor according to claim 1, wherein the coating further includes an IR-dye.

6. The printing plate precursor according to claim 5, wherein the IR-dye is water-soluble.

7. The printing plate precursor according to claim 5, wherein the IR-dye includes a cyanine dye.

8. The printing plate precursor according to claim 7, wherein the cyanine dye has a chemical structural according to one of the following formulas:

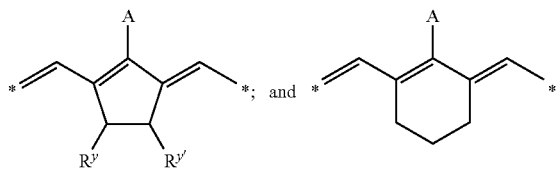

wherein

A represents hydrogen, a halogen, —NR$^1$—CO—R$^2$, or —NR$_1$SO$_2$R$^3$;

R$^1$ represents hydrogen or an optionally substituted alkyl or (hetero)aryl group, SO$_3^-$, COOR$^4$, or forms a ring structure together with R$^2$ or R$^3$;

R$^2$ and R$^3$ independently represent an optionally substituted alkyl or (hetero)aryl group, OR$^5$, NR$^6$R$^7$, or CF$_3$;

R$^4$ and R$^5$ independently represent an optionally substituted alkyl or (hetero)aryl group;

R$^6$ and R$^7$ independently represent hydrogen, an optionally substituted alkyl or (hetero)aryl group, or form a ring structure with each other;

R$^y$ and R$^{y'}$ independently represent hydrogen, an optionally substituted alkyl group, or represent necessary atoms to form an optionally substituted ring structure; and

* represent linking positions to a remaining portion of the IR-dye.

9. The printing plate precursor according to claim 8, wherein A represents:
—NR$^8$—CO—OC(CH$_3$)$_3$;
—NR$^8$—SO$_2$—CF$_3$; or
—NR$^8$—SO$_2$—C$_6$H$_4$—R$^9$; and
R$^8$ and R$^9$ independently represent hydrogen or an alkyl group.

10. The printing plate precursor according to claim 9, wherein the IR-dye has a chemical structure:

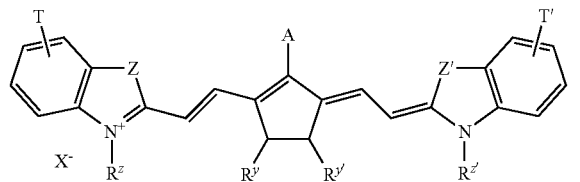

wherein

T and T' independently represent one or more substituents or an annulated ring;

Z and Z' independently represent —O—, —S—, —CR$^{10}$R$^{11}$C—, or —CH═CH— in which R$^{10}$ and R$^{11}$ independently represent an alkyl or aryl group;

R$^z$ and R$^{z'}$ independently represent an optionally substituted alkyl group; and X$^-$ renders the IR-dye neutral.

11. The printing plate precursor according to claim 5, wherein the IR-dye is present in the coating in an amount between 5 and 50% by weight.

12. A method for making a lithographic printing plate precursor comprising the steps of:

providing a support;

applying on the support a coating as defined in claim 1; and drying the coating.

13. A method for making a lithographic printing plate comprising the steps of:

providing the printing plate precursor according to claim 1; and image-wise exposing the printing plate precursor to heat and/or infrared light.

14. The method according to claim 13, wherein the image-wise exposing step converts exposed areas of the printing plate precursor from a hydrophilic state to a hydrophobic state.

15. A method of lithographic printing comprising the steps of:

providing the printing plate precursor according to claim 1;

image-wise exposing the printing plate precursor to heat and/or infrared light to convert exposed areas of the printing plate precursor from a hydrophilic state to a hydrophobic state at exposed areas; and mounting the exposed printing plate precursor on a printing press and starting printing by applying ink and/or dampening liquid to the exposed printing plate precursor.

* * * * *